United States Patent
Agrawal et al.

(10) Patent No.: US 12,557,352 B2
(45) Date of Patent: Feb. 17, 2026

(54) FORKSHEET TRANSISTOR DEVICE WITH AIR GAP SPINE

(71) Applicant: Intel Corporation, Santa Clara, CA (US)

(72) Inventors: Ashish Agrawal, Hillsboro, OR (US); Christopher M. Neumann, Portland, OR (US); Seung Hoon Sung, Portland, OR (US); Marko Radosavljevic, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 940 days.

(21) Appl. No.: 17/455,938

(22) Filed: Nov. 22, 2021

(65) Prior Publication Data

US 2023/0163168 A1 May 25, 2023

(51) Int. Cl.
*H10D 62/10* (2025.01)
*H10D 30/01* (2025.01)
*H10D 30/62* (2025.01)

(52) U.S. Cl.
CPC ......... *H10D 62/116* (2025.01); *H10D 30/024* (2025.01); *H10D 30/62* (2025.01)

(58) Field of Classification Search
CPC .... H10D 62/121; H10D 30/014; H10D 30/43; H10D 64/017
See application file for complete search history.

(56) References Cited

U.S. PATENT DOCUMENTS

| | | | |
|---|---|---|---|
| 2019/0378903 A1 | 12/2019 | Jeon et al. | |
| 2020/0083352 A1* | 3/2020 | Chanemougame | H10D 30/6757 |
| 2021/0233911 A1 | 7/2021 | Feng et al. | |
| 2021/0296315 A1 | 9/2021 | Lilak et al. | |
| 2022/0139914 A1* | 5/2022 | Cheng | H10D 30/6735 257/288 |

(Continued)

FOREIGN PATENT DOCUMENTS

| | | |
|---|---|---|
| CN | 111584486 A | 8/2020 |
| EP | 3758055 A1 | 12/2020 |

OTHER PUBLICATIONS

Extended European Search Report received for EP Application No. 22201315.3, dated Mar. 27, 2023. 13 pages.

(Continued)

*Primary Examiner* — Tuan A Hoang
(74) *Attorney, Agent, or Firm* — Arcane Law PLLC

(57) ABSTRACT

Techniques are provided herein to form a forksheet device with an air gap spine. The air gap may be devoid of gas, or not. In an example, the device includes a first semiconductor body laterally extending from a first side of a void (air gap) and having an end surface that defines part of the first side of the void, and a second semiconductor body laterally extending from a second side of the void and having an end surface that defines part of the second side of the void. A first gate structure is on the first semiconductor body, and a second gate structure is on the second semiconductor body. In some cases, a spacer structure is between a source or drain region and the corresponding gate structure, the spacer structure including one or more portions of the void. The void may be created with a backside process, post-device formation.

20 Claims, 9 Drawing Sheets

(56) References Cited

U.S. PATENT DOCUMENTS

2023/0066597 A1* 3/2023 Cheng ............... H10D 84/0167

OTHER PUBLICATIONS

Veloso, et al., "Nanosheet FETs and their Potential for Enabling Continued Morre's Law Scaling," (2021) 5th IEEE Electron Devices Technology & Manufacturing Conference. 3 pages.

* cited by examiner

FORKSHEET TRANSISTOR DEVICE WITH AIR GAP SPINE

FIELD OF THE DISCLOSURE

The present disclosure relates to integrated circuits, and more particularly, to the fabrication of forksheet transistor devices.

BACKGROUND

As integrated circuits continue to scale downward in size, a number of challenges arise. For instance, reducing the size of memory and logic cells or otherwise increasing transistor device density is becoming increasingly more difficult. As transistor devices are spaced closer together to increase device density on a given die, certain fabrication procedures become challenging. In addition, performance-inhibiting parasitics arise, such as undesired capacitance.

Figure 1A:
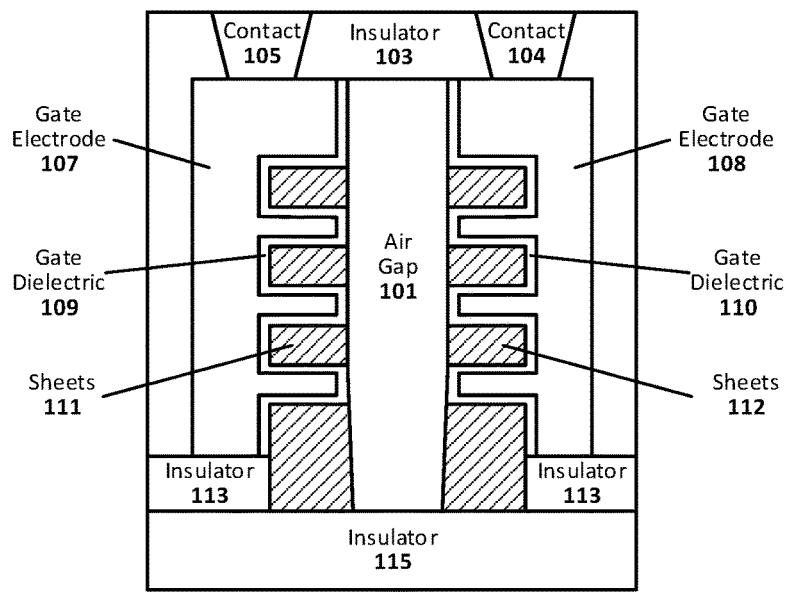
FIGS. 1a, 1b and 1d are cross-sectional side views of an example integrated circuit including a forksheet device having an air gap spine, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may be tapered and/or have rounded corners), and some features may have surface topology or otherwise be non-smooth, given real world limitations of the processing equipment and techniques used.

DETAILED DESCRIPTION

Techniques are provided herein to form a forksheet transistor device with an air gap spine. According to some embodiments, after completion of the forksheet transistor device on a given wafer, the wafer is flipped and the substrate is polished until the dielectric spine is revealed from the backside. The spine can be selectively etched out leaving an air gap between left and right transistor devices. Once the air gap is formed, a non-conformal deposition of dielectric material can be used to effectively cap and preserve the air gap, such as a non-conformal layer of silicon oxide or silicon nitride. In some embodiments, once the spine is removed, inner spacers that separate the gate structure from the source and drain regions are exposed and thus can also be selectively etched to provide a further air gap in place of those inner spacers. Thus, in such cases, the air gap that replaces the dielectric spine may also extend into the internal spacer locations as well, and the non-conformal deposition of dielectric material can be used to preserve that entire air gap. Note that the air gap may include gas (e.g., oxygen, nitrogen), or may be devoid of gas (vacuum). To this end, the term "air gap" as used herein is not intended to be limited to voids that contain components of air (e.g., oxygen, nitrogen); indeed, if the capping layer is provided under vacuum, then the air gap may remain under vacuum post-capping and thus not contain any air or gas. Numerous forksheet transistor device configurations will be appreciated in light of this disclosure.

General Overview

As previously noted above, there remain a number of non-trivial challenges with respect to designing forksheet transistors. In more detail, a complementary metal oxide semiconductor (CMOS) forksheet configuration can be used to reduce the lateral spacing between an n-type metal oxide semiconductor (NMOS) transistor and a p-type metal oxide semiconductor (PMOS) transistor by having them self-align using a dielectric structure referred to as a spine. Such a configuration enables substantial lateral scaling because the NMOS and PMOS devices can be moved even closer together, as compared to nanosheet architecture where the NMOS to PMOS spacing is limited by lithography constraints. However, in forksheet devices, cross-talk between the NMOS and PMOS devices through the dielectric spine can cause degradation in performance and increased leakage current. This effectively imposes a restriction on the minimum spine thickness and thus limits the scalability in forksheet configurations. A possible solution is to use a spine dielectric having a lower dielectric constant, in effort to reduce cross-talk through the spine. However, replacing the spine dielectric with a low-k material (e.g., porous silicon oxide or porous silicon carbide) penalizes the structural integrity of the spine and makes it susceptible to subsequent standard processing (such as etches and cleans), which may result in degraded yield.

Thus, and in accordance with an embodiment of the present disclosure, techniques are provided herein to replace the dielectric spine of a forksheet transistor device with an air gap or void, which may or may not contain gas (e.g., air and/or one or more process gasses). The techniques are particularly useful in the context of a forksheet configuration having a PMOS device and an NMOS device separated by a dielectric spine and connected in a CMOS arrangement (e.g., logic inverter or other CMOS logic circuit), but can be used more generally in any forksheet configuration where it is desirable to have a thinner dielectric spine so that the left transistor structure can be closer to the right transistor structure. According to some embodiments, after completion of the forksheet transistor device on a given wafer, the wafer is flipped and the substrate is polished until the dielectric spine is revealed from the backside. The spine can be selectively etched out leaving an air gap between the left (e.g., NMOS) and right (e.g., PMOS) devices. Note that the etch can be selective to any other exposed materials, such as shallow trench isolation (STI) or interlayer dielectric (ILD)

material, gate dielectric material, and channel material. For instance, the spine can be a nitride (e.g., silicon nitride), while the STI and gate dielectric materials can be oxides (e.g., silicon dioxide and hafnium oxide, respectively) and the channel material can be silicon or silicon germanium (SiGe), according to some examples. The spine etch can be anisotropic and/or an isotropic, as will be explained in turn. Once the air gap is formed, a non-conformal deposition of dielectric material can be used to effectively cap and preserve the air gap, such as a non-conformal layer of silicon oxide or silicon nitride deposited by physical vapor deposition (PVD) or chemical vapor deposition (CVD). Further note that the width of the air gap can be relatively thin (e.g., less than 20 nanometers, such as in the range of 6 to 16 nanometers), compared to the width of a dielectric-filled spine that is not susceptible to cross-talk (e.g., greater than 20 nanometers, such as 30 to 50 nanometers).

In some embodiments, with the spine is removed, inner spacers that separate the gate structure from the source and drain regions are exposed and thus can also be selectively etched to provide a further air gap in place of those inner spacers. Thus, the air gap that replaces the dielectric spine may extend into the internal spacer locations as well, and the non-conformal deposition of dielectric material can be used to preserve that entire air gap. Note that the internal spacers can be formed of the same material that the makes up the dielectric spine, thus facilitating the removal of both features in a given etch scheme. For instance, in one embodiment, the internal spacers and spine are all silicon nitride, and are of a given geometry and scale that they can be contemporaneously removed using an isotropic etch. In some cases, the internal spacer geometry may be, for example, small relative to the spine geometry. In such cases, the etch process can be multimodal. For instance, at least a portion of the spine can be first etched with a directional anisotropic etch so as to expose all of the spacers to be removed, and the etch process can then be transitioned to an isotropic etch to more aggressively etch the now exposed internal spacers and any remaining portion of the spine. In still other embodiments, the spine and the internal spacers are compositionally diverse and etch selective with respect to each other, such as the example case where the spine is silicon nitride and the internal spacers are titanium oxide (which can be etched selective to nitrides as well as other oxides). In such an example case, the spine can be selectively etched with a first etch process (e.g., anisotropic nitride etch), and the internal spacers can be selectively etched with a second etch process (e.g., isotropic titanium oxide etch).

A number of advantages of the techniques described herein will be apparent. For example, note that an air gap features the lowest k-value of 1, which can eliminate or otherwise significantly reduce cross-coupling (e.g., electrostatic cross-talk) between the left (e.g., NMOS) and right (e.g., PMOS) devices of a forksheet configuration, according to some embodiments. In addition, the lateral width of the spine (which corresponds to the lateral spacing between the left and right devices) can be further scaled, without penalty from cross-coupling. Moreover, note that no frontend process changes are needed when forming the forksheet devices; nor are any changes to the spine material required, according to some examples. As such, the fidelity of given CMOS or otherwise established processing can be maintained. Also, in some example embodiments, by creating an air gap in the region of inner spacer, parasitic capacitance in that region is greatly reduced and switching performance may be enhanced. In addition, the lateral spacing between the gate and source/drain regions can be further scaled (an air gap spacer can be thinner than a dielectric spacer, and still function properly). Likewise, contact poly pitch further scaling is enabled by removal of inner spacer between gate and source/drain. Moreover, just as with spine removal, such internal spacer removal is agnostic to given CMOS or other established processing.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); electron energy loss spectroscopy (EELS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools (e.g., SEM, TEM, EDX, EELS, SIMS) can be used to image or otherwise indicate features such as an air gap in the spine region between left and right devices of a forksheet configuration, and/or an air gap in the inner spacer region between gate and source/drain region. Such tools may also be used to show features such as a backside substrate that has been etched away, and/or a non-conformal capping layer over an air gap spine.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1a is a cross-sectional side view of an example integrated circuit including a forksheet device having an air gap spine 101, in accordance with an embodiment of the present disclosure. As can be seen, the forksheet device generally includes first (left) and second (right) transistor devices separated by air gap spine 101. The left transistor device includes a number of semiconductor bodies or sheets 111, each laterally extending from a first side of air gap spine 101, a left gate structure on sheets 111, and a contact 105 on the left gate structure. The right transistor device similarly includes a number of semiconductor bodies or sheets 112, each laterally extending from a second side of air gap spine 101, a right gate structure on sheets 111, and a contact 104 on the right gate structure. The left gate structure includes gate dielectric 109 and gate electrode 107, and the right gate structure includes gate dielectric 110 and gate electrode 108. Insulator material 103 fills out the structure. Insulator 113 provides shallow trench isolation (STI), and insulator 115 provides a capping layer over air gap spine 101. As will be appreciated, this particular cross-section is taken through the gate regions of the forksheet device, such that the source and drain regions corresponding to each gate structure are not visible, but can be seen in the plan view of FIG. 1c.

The air gap spine 101 may contain gas, or not, and hence the label of air gap spine is simply used for ease of description and not intended to imply that the spine is filled with air or any other gas for that matter. To this end, and as previously noted, air gap spine 101 may be a void or space that is free of gas (such as air or processing gas), or is otherwise under a vacuum. Although the geometry of the air gap spine 101 can vary from one embodiment to the next, in some examples, the air gap spine 101 has a vertical height in the range of 50 nm to 200 nm (e.g., 75 to 135 nm) and a horizontal width in the range of 5 nm to 25 nm (e.g., 6 to 10 nm). The height-to-width aspect ratio can be in the range of, for instance, 2:1 to 10:1. Note, in this example, that walls of air gap spine 101 are effectively defined by surfaces of the gate structure and end surfaces of the semiconductor bodies 111 and 112. In some other example cases, there may be a residual or trace amount or otherwise thin layer (e.g., monolayer) of spine dielectric material that remains along the sides of air gap spine 101. Any such layer or residue, if present, may be discontinuous or otherwise inconsistent, due to the etch process to remove that spine dielectric material, as will be explained in turn. Further note that air gap spine 101 not only separates the left and right gate structures, but also separates the left and right source regions as well as the left and right drain regions, as shown in FIG. 1c.

The semiconductor bodies 111 and 112, which in this case are sheets in this example case, can be any number of semiconductor materials, such as group IV material (e.g., silicon, germanium, or SiGe) or group III-V materials (e.g., indium gallium arsenide). The semiconductor bodies 111 and 112 may be doped, partially doped (e.g., such as the example case where a body is doped at its ends but not in the middle portion), or undoped, and may be shaped or sculpted during the gate formation process, according to some embodiments. In some cases, semiconductor bodies 111 and 112 may be a multilayer structure, such as a SiGe body cladded with germanium, or a silicon body cladded with SiGe. Any number of channel configurations can be used. The semiconductor bodies 111 may be the same material as semiconductor bodies 112, or may be compositionally different from semiconductor bodies 112 so as to provide etch selectivity that may be useful in a release process.

Figure 1B:
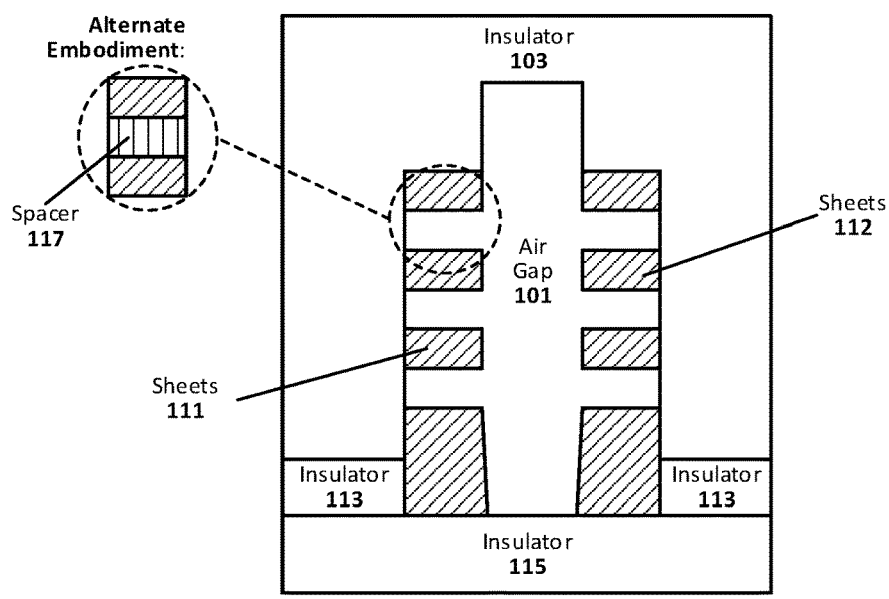
Figure 1C:
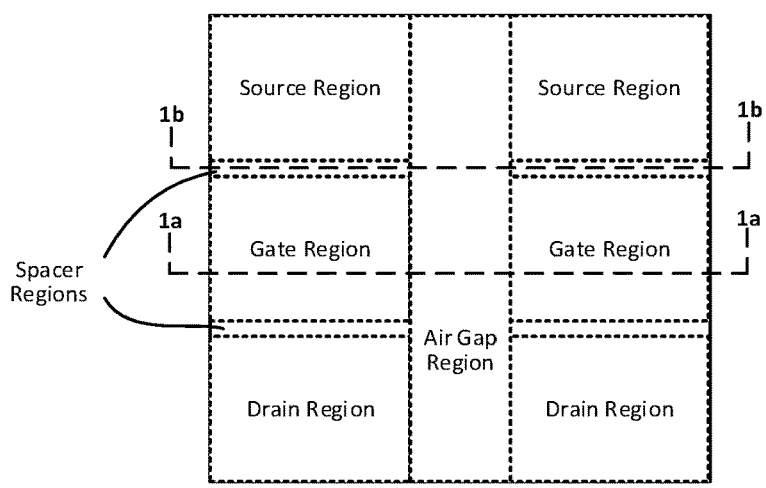
FIG. 1c is a cross-sectional plan view of an example integrated circuit including a forksheet device having an air gap spine, in accordance with an embodiment of the present disclosure.
Figure 1D:
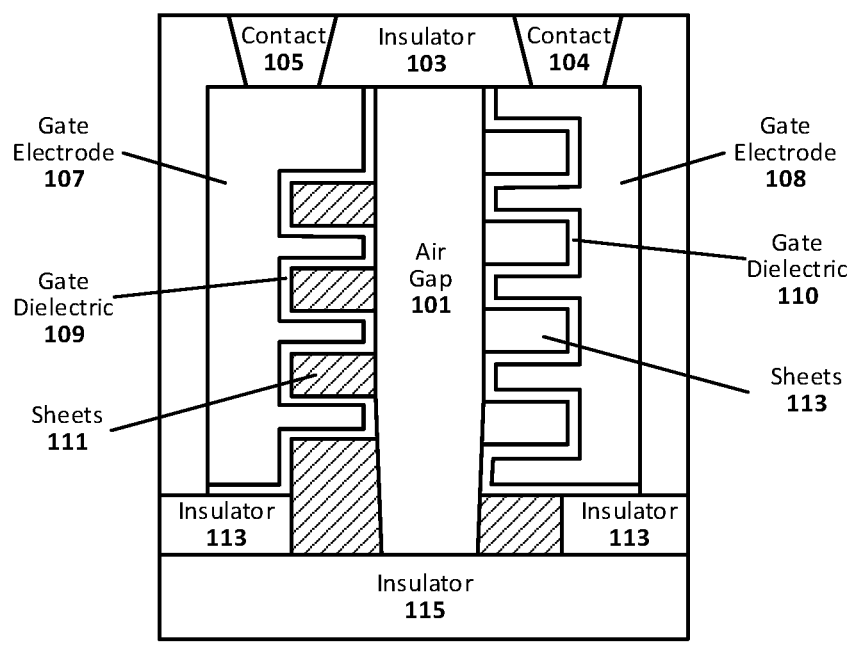

In this example case, semiconductor bodies 111 and 112 are of the same material (e.g., silicon, germanium, SiGe, gallium indium arsenide) as indicated with slanted cross-hatching and are aligned with each other and equal in number, but in other embodiments they may be different materials (e.g., germanium or SiGe for PMOS device on left side and silicon for NMOS device on right side) and/or unequal in number and/or offset from each other (such as shown in the example of FIG. 1d). Although the geometry of the bodies 111 and 112 can vary from one embodiment to the next, in some examples they each have a horizontal length in the range of 6 nanometers (nm) to 30 nm, and a vertical height or thickness in the range of 4 nm to 8 nm. The base portion is partially gated in this example and can have a vertical height or thickness in the range of, for example 20 nm to 50 nm and a horizontal length in the range of 8 nm to 32 nm. The additional vertical height of this base portion effectively provides a buffer zone in case insulator 115 ebbs into the air gap spine during a non-conformal deposition capping process, as will be explained in turn. Further note that the horizontal length of the base portion may be slightly longer than the upper sheets, due to inward tapering of spine area (e.g., such as might occur when the spine is etched using a topside etch process, particularly for spines having a relatively high height-to-width aspect ratio (e.g., 5:1, or higher).

Each gate structure can be formed via gate-first or gate-last processing, and may include any number of suitable gate materials and configurations. As noted above, each of structure includes a gate electrode (107 and 108) and a gate dielectric (109 and 110). The gate structures may also include a spacer structure that separates the given gate structure from its corresponding source and drain regions. Such a spacer structure may include both external and internal portions, and may be, for example, silicon nitride or silicon oxynitride or silicon oxycarbonitride. The gate dielectrics 109 and 110 may be the same or different, and may include any suitable gate dielectric material(s), such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some example embodiments, an annealing process may be carried out to improve gate dielectric quality when a high-k material is used. Further, the gate electrodes 107 and 108 may be the same or different, and include a wide range of suitable metals or metal alloys, such as aluminum, tungsten, cobalt, ruthenium, molybdenum, titanium, tantalum, copper, titanium nitride, or tantalum nitride, for example.

In some embodiments, the gate dielectrics 109 and 110 and/or gate electrodes 107 and 108 may include a multilayer structure of two or more material layers or components. For instance, in one such embodiment, the gate dielectrics 109 and 110 can each be a bi-layer structure having a first dielectric material (e.g., silicon dioxide) in contact with the corresponding sheets 111 and 112 and a second high-k dielectric material (e.g., hafnium oxide) in contact with the first dielectric material. Likewise, the electrodes 107 and 108 may include a central metal plug or fill metal portion (e.g., tungsten, cobalt, molybdenum, ruthenium) with one or more outer workfunction layers (e.g., titanium nitride for PMOS workfunction, or an aluminum-containing alloy such as titanium aluminum carbide for NMOS workfunction) and/or barrier layers (e.g., tantalum nitride), and/or a resistance reducing cap layer (e.g., cobalt). In some embodiments, the gate dielectrics 109 and 110 and/or gate electrodes 107 and 108 may include concentration grading (increasing or decreasing) of one or more materials therein. Numerous gate structure configurations can be used along with the techniques provided herein, and the present disclosure is not intended to be limited to any particular such configurations.

FIG. 1b is the same structure as shown in FIG. 1a, except that the cross-section is taken through spacer regions of the forksheet device, so as to show that portions of the air gap making up the spine 101 extend into the internal spacer regions between a given gate structure and its corresponding source and drain regions, according to some embodiments. In more detail, and as noted above, the gate structures may include spacer structures that separate the given gate structure from its corresponding source and drain regions. The top of such external spacers can be seen in the plan view of FIG. 1c, which is not necessarily drawn to scale but instead is provided to show the general layout of a forksheet device, as seen from a top view. An external portion of a given spacer structure can be formed, for example, during dummy gate processing (in a gate-last process) or during regular gate processing (in a gate-first process). The internal spacers can be formed during the source and drain processing (e.g., from within the source/drain recesses, prior to epitaxial deposition of the source/drain materials), and are best shown in the alternative embodiment depicted in FIG. 1b (spacer 117). Such external and internal spacers may be the same dielectric material but need not be, and in some example cases are silicon nitride, silicon oxynitride, or silicon oxycarbonitride. However, in some embodiments, such spacer materials are removed along with dielectric spine material, when forming air gap spine 101, as also shown in FIG. 1b.

Numerous source and drain configurations can be used, and the present disclosure is not intended to be limited to any particular ones. In some example embodiments, the source and drain regions are epitaxial source and drain regions that are provided after the relevant portion of a fin structure from which sheets 111 and 112 are formed is isolated and etched away or otherwise removed. In other embodiments, the source/drain regions may be doped portions of that fin structure, rather than epi regions. In some embodiments using an etch and replace process, the epi source drain regions are faceted and overgrown from a trench within insulator material (e.g., shallow trench isolation, or gate spacer that deposits on the sides of the fin structure in the source and drain locations), and a corresponding source or drain contact structure lands on that faceted portion. Alternatively, in other embodiments, any faceted portion of epi source and drain regions can be removed (e.g., via chemical mechanical planarization, or CMP), and a corresponding source or drain contact structure lands on that planarized portion.

The source and drain regions can be any suitable semiconductor material and may include any dopant scheme. For instance, the left source and drain regions of FIG. 1c may be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. The right source and drain regions of FIG. 1c may be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, the left side source and drain regions are boron-doped SiGe, and the right side source and drain regions are phosphorus-doped silicon. In a more general sense, the source and drain regions can be any semiconductor material suitable for a given application.

In some cases, the epi source and drain regions may include a multilayer structure, such as a germanium cap on a SiGe body, or a germanium body and a carbon-containing SiGe spacer or liner between the corresponding channel region and that germanium body. In any such cases, a portion of the epi source and drain regions may have a component that is graded in concentration, such as a graded germanium concentration to facilitate lattice matching, or a graded dopant concentration to facilitate low contact resistance. Any number of source and drain configurations can be used as will be appreciated, and the present disclosure is not intended to be limited to any particular such configurations.

The contacts 104 and 105 can have any number of configurations. In some example embodiments, the contacts 104 and 105 include a contact metal and a conductive liner or barrier layer, deposited in a contact trench formed over the source and drain regions. The liner can be, for example, tantalum or tantalum nitride, and metal can be any suitable plug/core material, such as tungsten, aluminum, ruthenium, molybdenum, cobalt, titanium, copper, or alloys thereof. In some example cases, contact 104 can be n-type similar to n-type gate electrode 108, and contact 105 can be p-type similar to p-type gate electrode 107. For instance, according to some such embodiments, the liner can be titanium for NMOS source/drain contacts, or nickel or platinum for PMOS source/drain contacts. In still other embodiments, the contacts 104 and 105 may include resistance reducing materials (e.g., nickel, platinum, nickel platinum, cobalt, titanium, germanium, nickel, gold, or alloys thereof such as germanium-gold alloy, or a multilayer structure of titanium and titanium nitride all have good contact resistance), in addition to contact metal and any liner. Other embodiments may be configured differently. In a more general sense, any number of source/drain and gate contact configurations and forming processes can be used, and the present disclosure is not intended to be limited to any particular such contact configurations or processes.

Insulator 103 can be any number of suitable dielectric materials, such as silicon dioxide, silicon carbide, silicon oxycarbide, silicon oxycarbonitride, or any other suitable dielectric material. Insulator 113 may be the same material as insulator 103, but need not be. Likewise, insulator 115 may be the same material as insulator 103 and/or 113, but need not be.

One or more interconnect layers can be formed above contacts 104 and 105, and possible below layer 115, according to some embodiments. Such interconnect layers can have many configurations, but generally include one or more dielectric layers (e.g., silicon dioxide) having conductive features (e.g., copper or aluminum vias, conductive runs, etc.) formed therein.

FIG. 1d illustrates a structure similar to the structure of FIG. 1a, except that semiconductor bodies 111 and 112 are compositionally different from one another and are offset from each other, according to an embodiment. Such a configuration can be implemented, for instance, using a stack of alternating layers, such as a stack of alternating layers of silicon and SiGe, wherein during gate processing of the left transistor device silicon layers are selectively etched away to release bodies of SiGe, and during gate processing of the right transistor device SiGe layers are selectively etched away to release bodies of silicon. This example embodiment further demonstrates that the semiconductor bodies 111 and 112 need not be equal in number. Here, the left side includes three fully gated sheets 111 and the right side includes four fully gated sheets 113. Further note that the gate dielectrics 109 and 110 can also be conformally deposited on the exposed surfaces such as insulator layer 113.

Methodology

FIGS. 2a-2k include cross-sectional views that collectively illustrate an example process for forming an integrated circuit configured with forksheet transistors having an airgap spine, in accordance with an embodiment of the present disclosure. Each figure shows an example structure that results from the process flow up to that point in time, so the depicted structure evolves as the process flow continues, culminating in the structure shown in FIGS. 2j-k, which is similar to the structure illustrated in FIGS. 1a-b. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
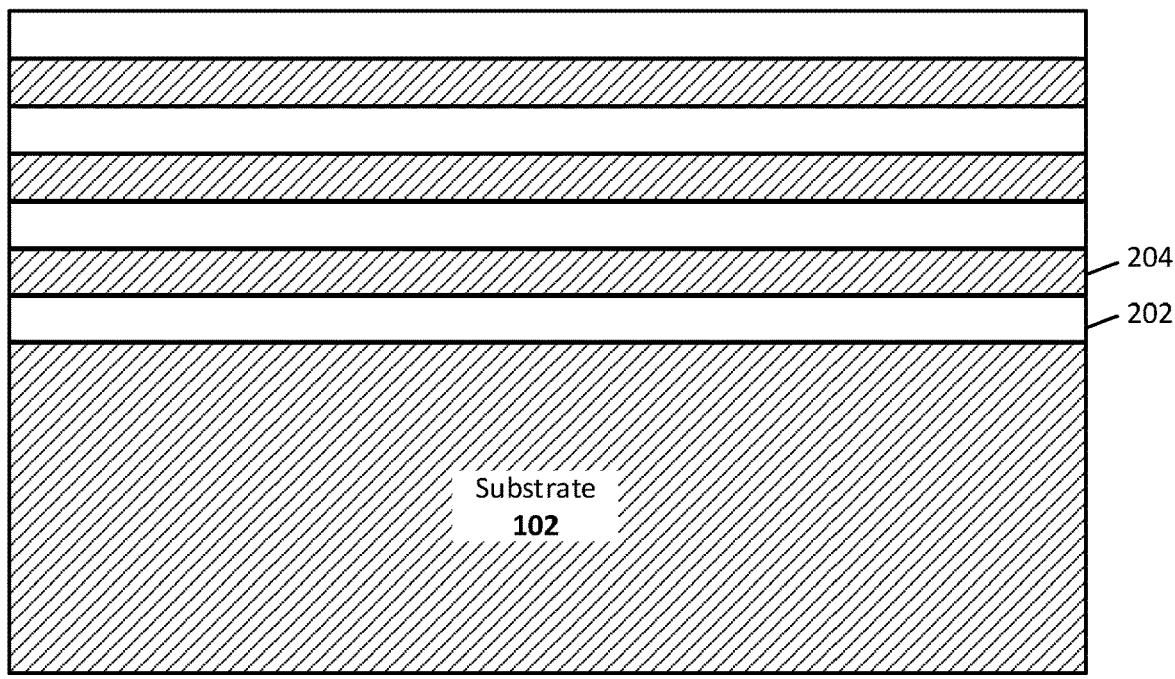
FIGS. 2a-2k collectively illustrate integrated circuit structures formed during a process for forming an integrated circuit that includes a forksheet device having an air gap spine, in accordance with an embodiment of the present disclosure

FIG. 2a illustrates a cross-sectional view across a substrate having a series of material layers deposited over it, according to an embodiment of the present disclosure. As can be seen, alternating material layers are deposited over substrate 102, including layers 202 alternating with layers 204, which are etch selective with respect to each other (layers 202 can be etched by an etch process that is selective to layers 204, and vice-versa). Any number of alternating layers 202 and 204 may be deposited over substrate 102. In some embodiments, layers 202 are SiGe and layers 204 are silicon, or vice-versa, although any number of other etch selective layer pairs can be used. While dimensions can vary from one example embodiment to the next, the thickness of each layer 202 may be between about 5 nm and about 20 nm. In some embodiments, the thickness of each layer 202 is substantially the same (e.g., within 1-2 nm) as the thickness of each layer 204. Each of layers 202 and 204 may be deposited using any known material deposition technique, such as CVD, PVD, or atomic layer deposition (ALD).

Figure 2B:
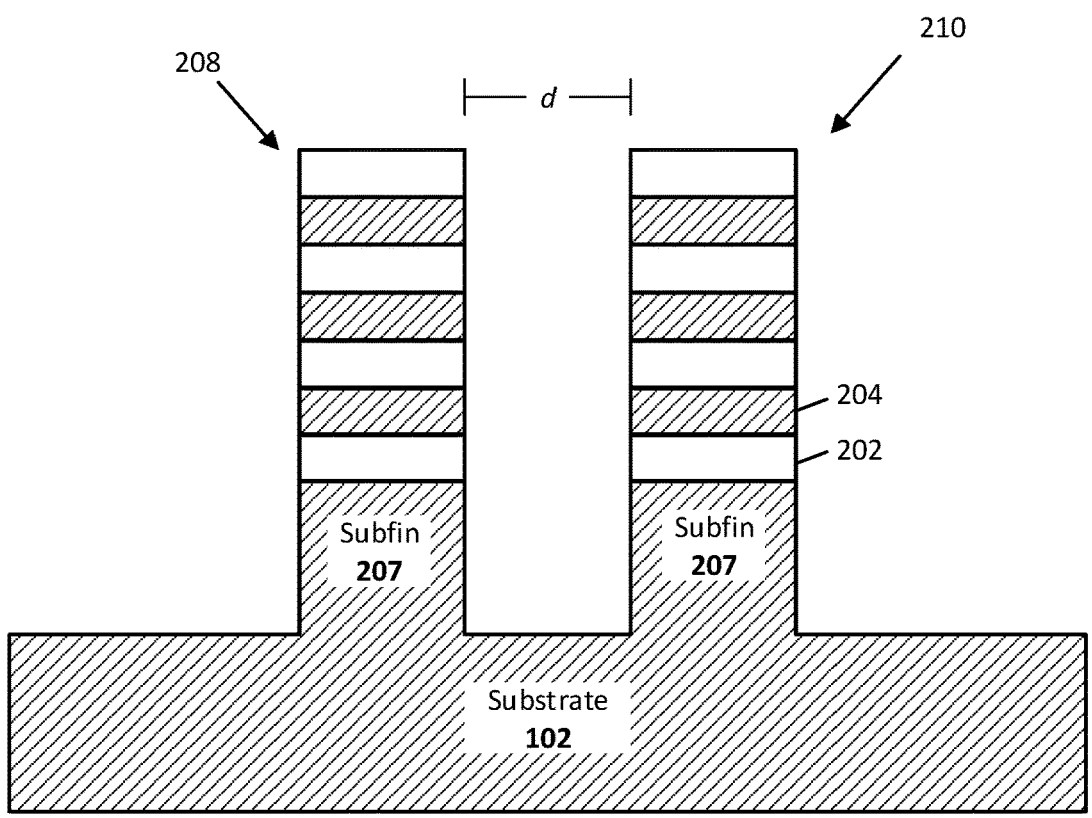

FIG. 2b illustrates a cross-sectional view of the structure shown in FIG. 2a following the formation of semiconductor fins, according to an embodiment. Any number of fins can be patterned across the integrated circuit, but only two (208 and 210, as part of a forksheet transistor device) are illustrated here for clarity. As can be seen, each of fins 208 and 210 includes a sub-fin portion 207 that is native to substrate 102, and a multi-layer structure having alternating layers 202 and 204 thereabove. Such multi-layer structures are conducive to forming nanosheets and ribbons. In some cases, layers 202 are the channel layers for both transistors of the forksheet device and layers 204 are sacrificial, or vice-versa. In other cases, layers 202 are the channel layers for one of the transistors in which layers 204 are sacrificial, and layers 204 are the channel layers for the other one of the transistors in which layers 202 are sacrificial.

The fins 208 and 210 may be formed, for example, by using a patterned hardmask or photoresist, which protects the underlying material during a directional etching process, such as reactive ion etching (RIE). While dimensions can vary from one example embodiment to the next, the total height of the fins extending above the surface of substrate 102 may be in the range of about 75 nm to about 250 nm. The distance d between adjacent fins 208 and 210 generally defines the width of the spine to be formed between the fins 208 and 210. According to some embodiments, the distance d is between 5 nm to 20 nm (e.g., 6 to 10 nm). As will be appreciated, the techniques provided herein are particularly useful for providing a spine width that is 20 nm or less, which would otherwise be problematic for standard processing and structures as previously explained (e.g., cross-talk, loss of structural integrity); however, the techniques can readily be applied to provide spine widths greater than 20 nm as well.

Figure 2C:
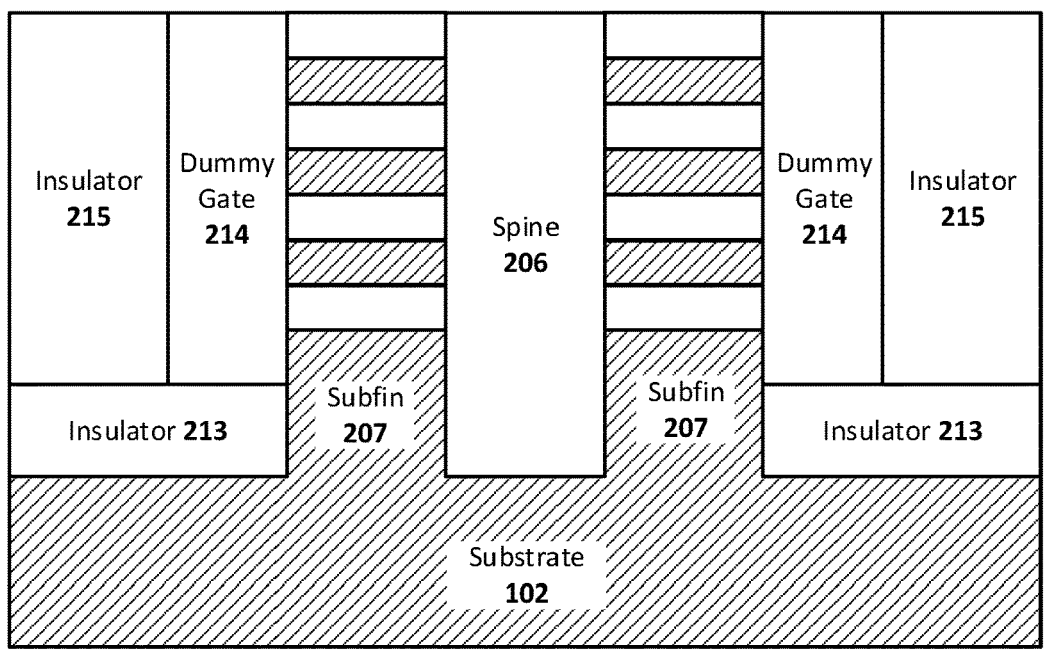

FIG. 2c illustrates a cross-sectional view of the structure shown in FIG. 2b following formation of dielectric spine 206, insulator 213 (STI or ILD), dummy gate structures 214, and insulator 215 (fill material), according to an embodiment of the present disclosure. The structure can be formed using any standard or proprietary processing. In an embodiment, dielectric spine 206 is formed by way of a conformal deposition of spine material (e.g., nitride, carbide, carbon hardmask, titanium-based oxide, or other material that can be selectively etched as will be explained in turn). Such a conformal deposition allows the relatively narrow gap between the fins 208 and 210 to fill with spine material but does not necessarily fill other parts of the structure, although other embodiments may use a non-conformal deposition. In any such cases, the spine region can be masked off, and any excess deposition of spine material can be removed from the structure by an appropriate etch. Insulator 213 can then be deposited to planarize the structure, and then recessed to provide STI or ILD 213. Dummy gate structures 214 can then be formed, which may include for instance, polysilicon or other suitable dummy gate material(s) which are sacrificial in nature. Insulator 215 can then be deposited to planarize the structure. Note that planarization may include, for instance, chemical mechanical planarization (CMP). Insulator 213 and 215 may be the same dielectric material, but need not be. In an example embodiment, insulator 213 and 215 are silicon dioxide, and spine 206 is silicon nitride or silicon carbide, although any number of etch materials systems can be used as will be appreciated in light of this disclosure.

Figure 2D:
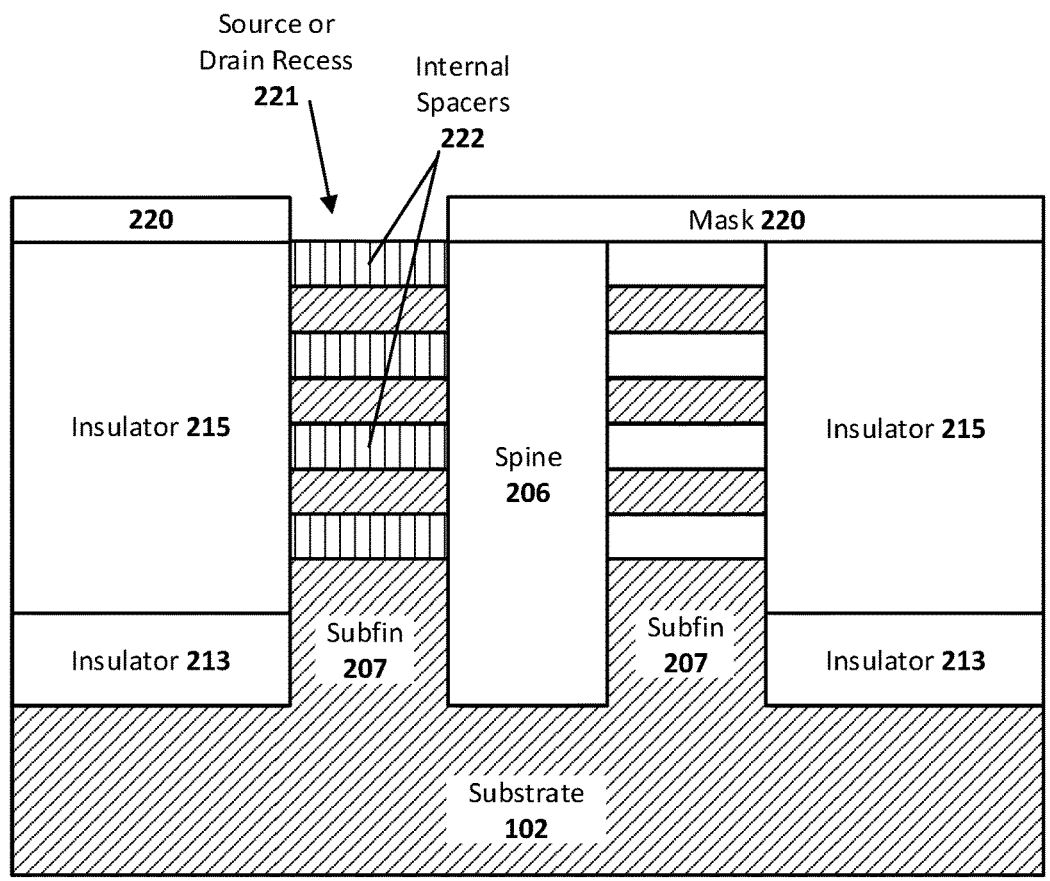

FIG. 2d illustrates a cross-sectional view of the structure shown in FIG. 2c following the patterning of mask 220 (e.g., carbon hardmask or photoresist) and etching of the source or drain recess 221, and after the formation of internal spacers 222, according to an embodiment. Note that this cross-section is taken through the source or drain region rather than through the gate region as shown in FIGS. 2a-c. In more detail, with recess 221 formed, the stack of alternating layers 202 and 204 with then channel region is exposed. At this point, layers 202 can be laterally recessed using an isotropic etch that is selective to layers 204 (or vice-versa), according to an embodiment. The lateral depth of this etch effectively defines the lateral thickness of the internal spacers 222 that will be between the gate structure 218 and the source or drain region 224 (to be subsequently deposited). Once the lateral recesses are formed, a conformal deposition of spacer material can be provided to fill those recesses, thereby creating internal spacers 222. Excess spacer material deposition can be removed via directional etch. In an embodiment, the internal spacers are the same material as spine 206 (e.g., silicon nitride, silicon carbide, carbon hardmask, or titanium oxide).

Figure 2E:
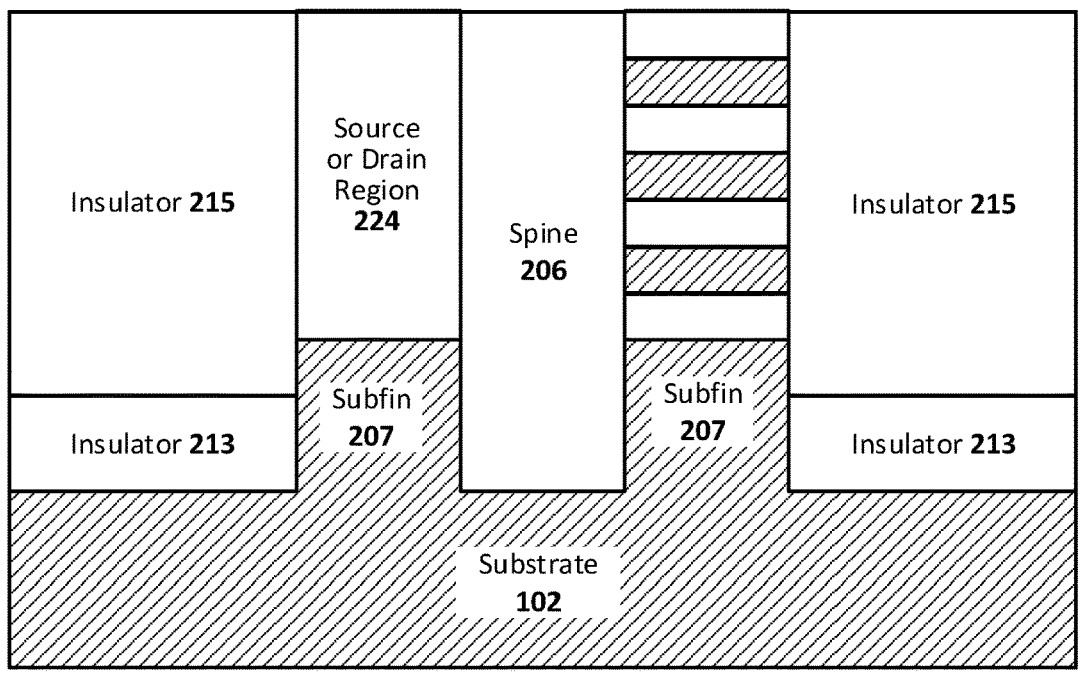
Figure 2F:
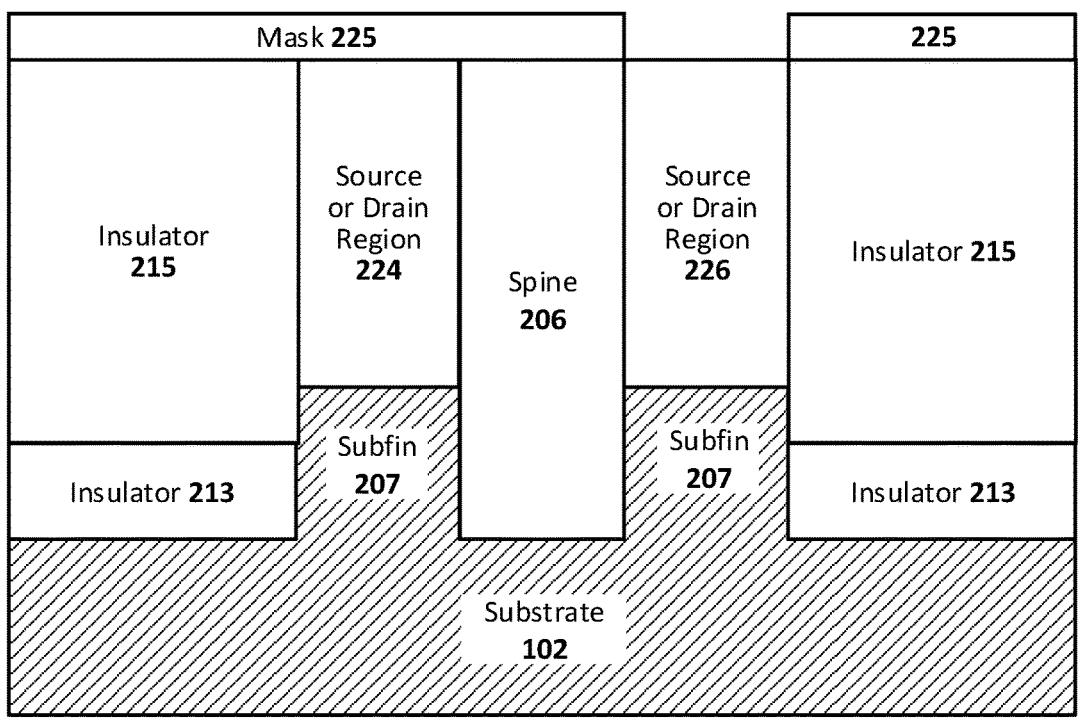

FIG. 2e illustrates a cross-sectional view of the structure shown in FIG. 2d following the epitaxial deposition of source or drain region 224 and planarization to remove mask 220 and any excess source/drain deposition protruding from recess 221, according to an embodiment. FIG. 2f illustrates a cross-sectional view of the structure shown in FIG. 2e following the patterning of mask 225 (e.g., carbon hardmask or photoresist) and the formation of source or drain region 226. Note that source or drain region 226 can be formed in a manner similar to that described with respect to the formation of source or drain region 224 (including formation of internal spacers). Further note that source or drain region 224 can be p-doped (e.g., boron-doped silicon or SiGe), and source or drain region 226 can be n-doped (e.g., phosphorus-doped silicon), or vice-versa. As will be further appreciated, both source and drain regions on one side of spine 206 (such as shown in FIG. 1c) can be formed in the same process (only one is shown in the cross-section of FIG. 2f). In other example embodiments, rather than removing the stack of alternating layers to form the source/drain recesses and epitaxially growing source/drain regions 224 and 226, the nanosheets of the channel region are kept in the source/drain regions and released via a selective etch process (in a similar fashion as done during gate processing, as will be explained in turn), and an epitaxial deposition is then carried out to effectively clad those released nanosheets, thereby forming source/drain regions 224 and/or 226. The previous relevant discussion with respect to source/drain materials and configurations is equally applicable here. Numerous configurations can be used.

Figure 2G:
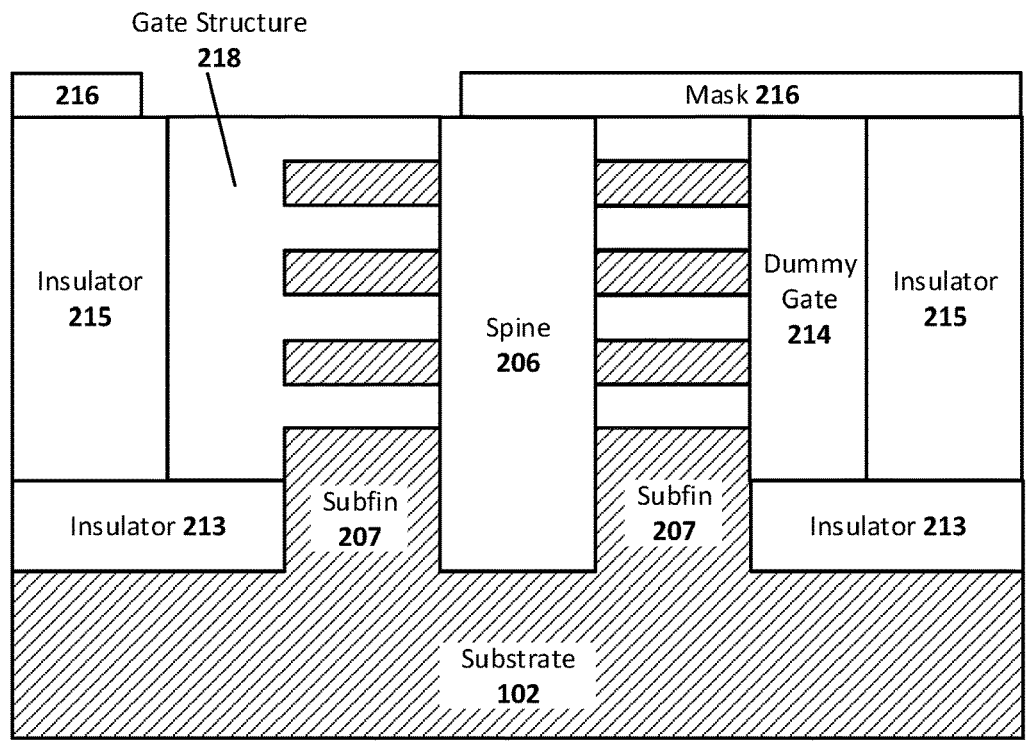
Figure 2H:
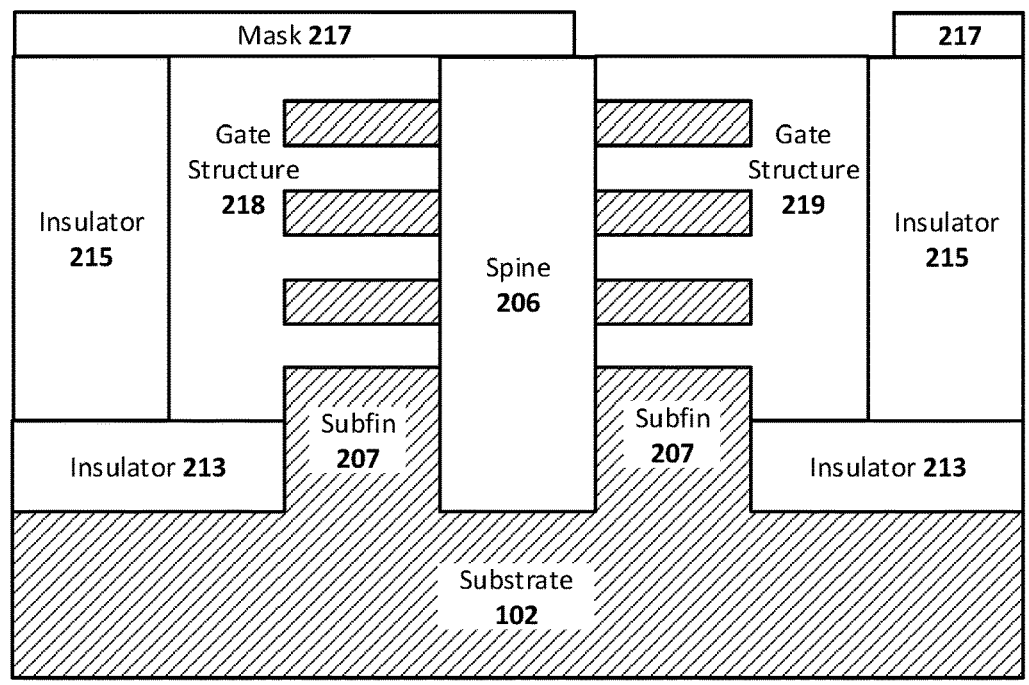

FIG. 2g illustrates a cross-sectional view of the structure shown in FIG. 2f following planarization to remove mask 225 and any excess source/drain 226 deposition, and patterning of mask 216 and formation of gate structure 218 to the left of spine 206, according to an embodiment. FIG. 2h illustrates a cross-sectional view of the structure shown in FIG. 2g following planarization to remove mask 216 and any gate structure 218 deposition, and after the patterning of mask 217 and formation of gate structure 219 to the right of spine 206, according to an embodiment. The masks 216 and 217 can be, for instance, carbon hardmasks or photoresist (e.g., similar to masks 220 and 225). Any number of masking techniques can be used for such masks. With the given mask 216 or 217 in place, the corresponding dummy gate 214 materials can be etched away so as to reveal the stack of alternating layers 202 and 204. Then, as shown in this example case, layers 202 are removed using an etch that is selective to layers 204, thereby releasing a number of nanosheets 204. Gate structures 218 and 219 each includes a gate dielectric and a gate electrode. The previous relevant discussion with respect to gate dielectric (109 and 110) and electrode (107 and 108) materials and configurations is equally applicable here. In an example case, nanosheets 204 are silicon, and each gate structure 218 and 219 includes a gate dielectric having a first layer silicon dioxide on the nanosheets and a second layer of high-k dielectric (e.g., hafnium oxide) on the first layer. In addition, gate structure 218 can have a p-type gate electrode (including p-type workfunction such as titanium nitride), and gate structure 219 can have an n-type gate electrode (including n-type workfunction such as titanium aluminum carbide).

Recall that there may be an external gate spacer (e.g., silicon nitride, silicon oxynitride, or silicon oxycarbonitride) on sides of the gate structures 218 and 219 (in the page and out of the page in this particular cross-section, as best shown in the plan view of FIG. 1c). Note how in this example, a portion of sub-fins 207 is gated. In other embodiments, the top of insulator 213 may be co-planar with the top of sub-fins 207, such that the gate structures 218 and 219 sit on top of the sub-fins and not on sides of the sub-fins 207.

In another example embodiment, layers 202 are removed using an etch that is selective to layers 204 during the forming process of gate structure 218 to provide nanosheets 204, and layers 204 are removed using an etch that is selective to layers 202 during the forming process of gate structure 219 to provide nanosheets 202. In such a case, for instance, nanosheets 202 can be germanium or SiGe and gate structure 219 can be a p-type gate structure, and nanosheets 204 can be silicon and gate structure 218 can be an n-type gate structure. Note in these examples that each of the gate structures 218 and 219 is on sides and an end of the corresponding nanosheets, similar to a tri-gate transistor configuration.

Figure 2I:
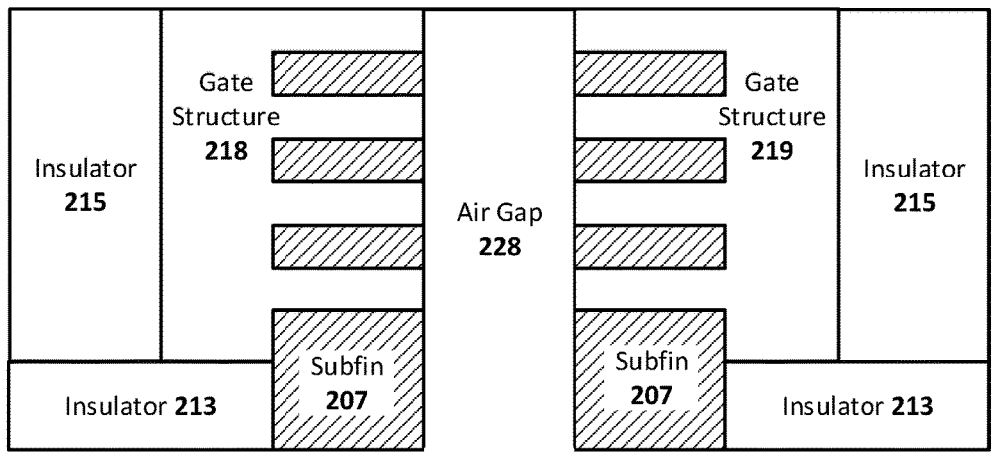

FIG. 2i illustrates a cross-sectional view of the structure shown in FIG. 2h following planarization to remove mask 217 and any gate structure 219 deposition, and after polishing of substrate 102 to expose spine 206 and the removal of spine 206 to provide air gap 228, according to an embodiment. Note that the structure can be inverted to polish substrate 102 and etch out spine 206. Further note that, prior to inverting the structure, an etch stop layer (e.g., silicon carbide) can be provisioned across the top of the gate structures 218 and 219 and insulator 215, so as to provide surface on which the etch process for removing spine 206 can stop. As explained above, the spine 206 can be removed using an etch that is selective to the other exposed materials, such as the semiconductor material making up the sub-fins 207 and sheets (indicated with cross-hatching), the exposed gate structure materials and insulator 213. In one such example case, the spine is a nitride or a carbide or a titanium-based oxide (e.g., silicon nitride or silicon carbide or titanium oxide), the semiconductor material making up the sub-fins 207 and sheets is silicon, germanium or SiGe, the exposed gate materials include gate dielectric (e.g., high-k material such as hafnium oxide), and the insulator 213 is silicon dioxide. And if present, an etch stop of silicon carbide. The resulting air gap 228 can have the same width as the spine 206 (e.g., 20 nm or less, such as 6 to 10 nm).

Note how in this example that each of the sheets (semiconductor bodies indicated with cross-hatching) of the left side has an end surface that defines a portion of a first side of the air gap or void 228; likewise, each of the sheets of the right side has an end surface that defines a portion of a second side of the air gap or void 228. Further note that gate structure 218 includes a number of surfaces that define part of the first side of the air gap or void 228, and gate structure 219 includes a number of surfaces that define part of the second side of the air gap or void 228. In some cases, for instance, the gate dielectric defines those portions of air gap or void 228.

Figure 2J:
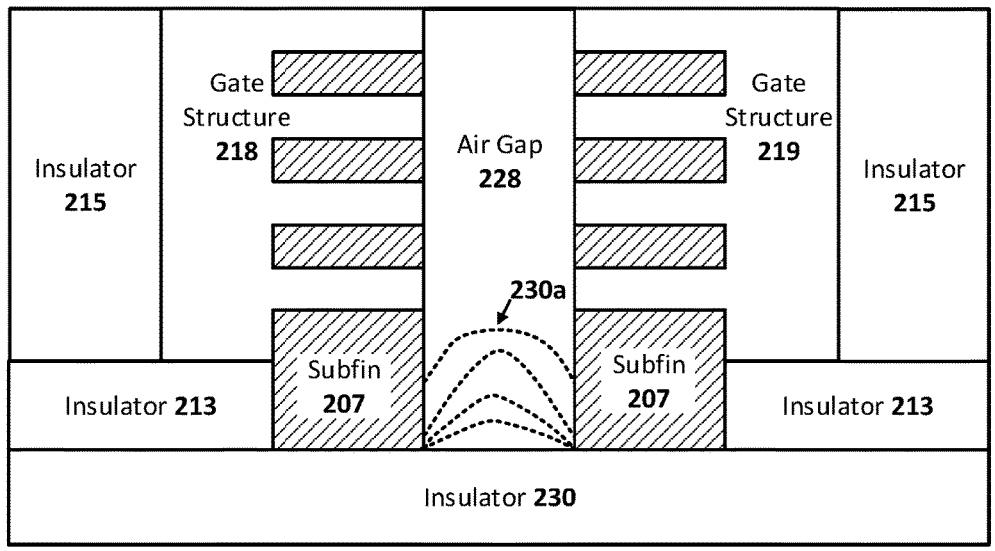

FIG. 2j illustrates a cross-sectional view of the structure shown in FIG. 2i following capping of air gap 228 with a non-conformal deposition of insulator 230, according to an embodiment. In some cases, the deposition of insulator 230 is done under vacuum, which means air gap 228 will likely be devoid of gases, although such a vacuum state is not required (in some case, air gap 228 may include air and/or one or more other process gases. To this end, and as previously noted above, the use of the expression air gap is not intended to limit the present description to voids filled with air. Further note that some insulator material 230 may creep or otherwise deposit into the air gap 228 so as to be between sub-fin regions 207, as shown at 230a. The depth of such ingress of insulator 230 into air gap 228 can vary depending on factors such as the material being deposited and the width of the air gap 228. In some cases, insulator 230 is silicon dioxide that is deposited via a non-conformal PVD or CVD.

Figure 2K:
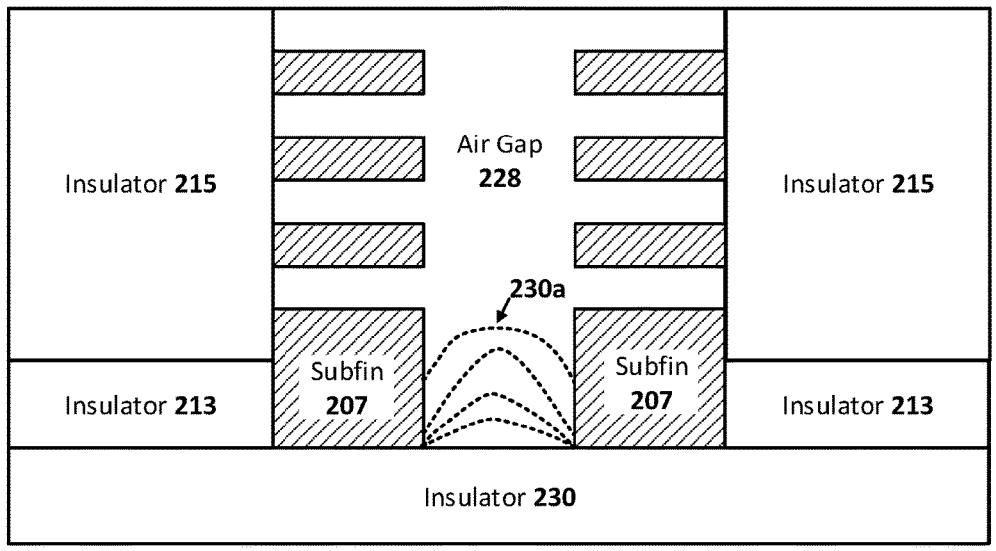

FIG. 2k illustrates a cross-sectional view of the structure shown in FIG. 2j, except that the cross-section is taken through spacer regions of the forksheet device, so as to show that portions of the air gap 228 making up the spine extend into the internal spacer regions between a given gate structure and its corresponding source and drain regions, according to an embodiment. As previously noted and shown (FIG. 1c), the spine 206 extends along the source and drain regions as well as the gate structure between those source and drain regions. Thus, when the spine 206 is removed, the internal spacers 222 between the source/drain regions and the gate structure are also exposed. To this end, an according to some embodiments, with the spine is removed, inner spacers 222 are also selectively etched along with the spine 206, so as to provide a further air gap 228 in place of those inner spacers 222. Thus, the air gap 228 that replaces the dielectric spine 206 may extend into the internal spacer 222 locations as well, and the non-conformal deposition of insulator 230 can be used to preserve that entire air gap.

Note that the internal spacers 222 can be formed of the same material that the makes up the dielectric spine 206, thus facilitating the removal of both features in a given etch scheme. For instance, in one embodiment, the internal spacers 222 and spine 206 are silicon nitride, and are of a given geometry and scale that they can be contemporaneously removed using an isotropic etch. In some cases, the internal spacer geometry may be, for example, small relative to the spine geometry. In such cases, the etch process can be multimodal, as previously explained. In one such example case, at least a portion of the spine 206 is first etched with a directional anisotropic etch so as to expose all of the spacers 222 to be removed, and the etch process can then be transitioned to an isotropic etch to more aggressively etch the now exposed internal spacers 222 and any remaining portion of the spine 206. In still other examples, the spine 206 and the internal spacers 222 are compositionally diverse and etch selective with respect to each other, such as the example case where the spine 206 is silicon nitride and the internal spacers 222 are titanium oxide (which can be etched selective to nitrides as well as other oxides such as silicon oxide and hafnium oxide). In such an example case, the spine 206 can be selectively etched with a first etch process (e.g., anisotropic nitride etch), and the internal spacers 222 can be selectively etched with a second etch process (e.g., isotropic titanium oxide etch).

The resulting structure can then be further processed to complete the integrated circuit, which may include, for example, one or more interconnect layers above and/or below the structure, including any local interconnect layers and contact layers. The integrated circuit can then be packaged.

Figure 3:
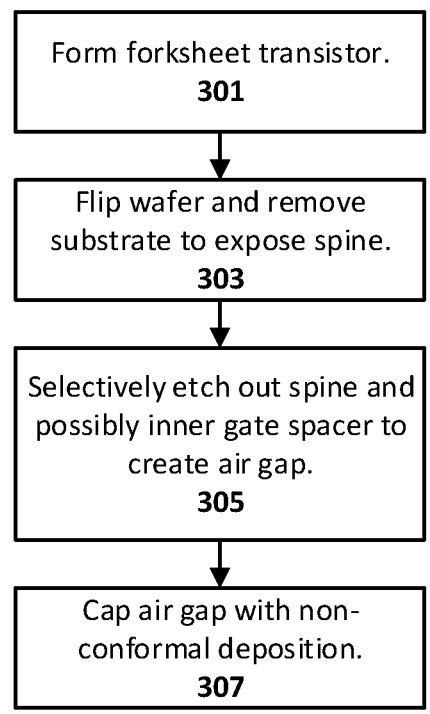
FIG. 3 is a flowchart of a fabrication process for a forksheet device having an air gap spine, in accordance with an embodiment of the present disclosure.

FIG. 3 is a flowchart of a fabrication process for a semiconductor device having an air gap spine, in accordance with an embodiment of the present disclosure. The method can be used to form, for instance, the structures of FIGS. 1a-d and 2a-k, although other structures will be appreciated. The method includes forming 301 a forksheet transistor, such as the example one shown in FIGS. 2d (cross-section through spacer region), 2f (cross-section through source or drain region) and 2h (cross-section through gate region). Any number of forksheet transistor structures having a dielectric spine can benefit from the techniques provided here, and the present disclosure is not intended to be limited to any particular such structures. The forksheet transistor can be formed on any number of substrates (e.g., silicon wafer). The method continues with inverting or flipping 303 the substrate and grinding or polishing the backside of the substrate to expose the dielectric spine of the forksheet transistor. Such grinding or polishing can be accomplished, for instance, via CMP. The method continues with selectively etching 305 the dielectric spine, and possibly the inner gate spacers, to create an air gap as previously explained. Recall from above that the etch process can be multimodal and include one or more anisotropic etch processes and/or one or more isotropic etch processes, depending on the particular configuration. FIGS. 2i-j show cross-sections taken through gate region, and FIG. 2k shows a cross-section taken through the spacer region, of an example structure after the dielectric spine has been etched out. Note the structure is shown in a non-inverted state. The method continues with capping 307 the air gap with a non-conformal deposition. The capping layer may be, for instance, silicon dioxide or other insulator material. FIGS. 2j-k show examples of such a capping layer. Recall that the capping layer may extend somewhat into the air gap.

Example System

Figure 4:
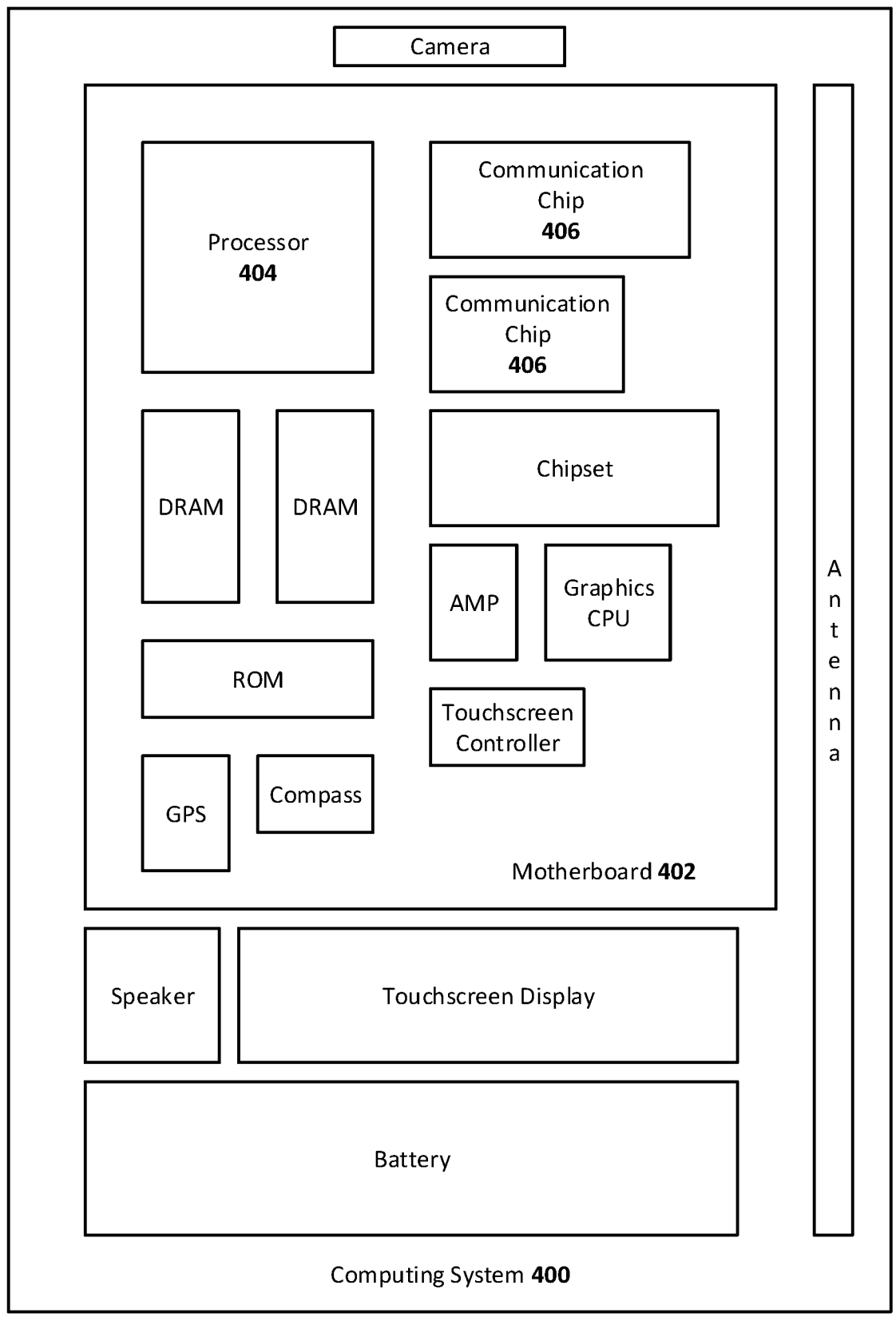
FIG. 4 illustrates a computing system including one or more integrated circuits, as variously described herein, in accordance with an embodiment of the present disclosure.

FIG. 4 illustrates a computing system including one or more integrated circuits, as variously described herein, in accordance with an embodiment of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board (PCB), whether a main board, a daughterboard mounted on a main board, or the only board of system 400, according to some examples.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., a module including an integrated circuit device having forksheet transistors with an air gap spine, as variously provided herein). In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing system 400 includes an integrated circuit die packaged within the processor 404. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more semiconductor devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 400 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes: a void; a first set of two or more semiconductor bodies each laterally extending from a first side of the void; a second set of two or more semiconductor bodies each laterally extending from a second side of the void; a first gate structure on the two or more semiconductor bodies of the first set; and a second gate structure on the two or more semiconductor bodies of the second set.

Example 2 includes the integrated circuit of Example 1, wherein each of the two or more semiconductor bodies of the first set has an end surface that defines a portion of the first side of the void; and each of the two or more semiconductor bodies of the second set has an end surface that defines a portion of the second side of the void.

Example 3 includes the integrated circuit of Example 2, wherein the end surfaces of the semiconductor bodies of the first and second sets are first end surfaces, and wherein: each of the two or more semiconductor bodies of the first set has a second end surface opposite the first end surface and that that is in contact with the first gate structure; and each of the two or more semiconductor bodies of the second set has a second end surface opposite the first end surface and that that is in contact with the second gate structure.

Example 4 includes the integrated circuit of any one of Examples 1 through 3, and includes: a first source region and a first drain region, each in contact with the one or more semiconductor bodies of the first set, such that the one or more semiconductor bodies of the first set are between the first source region and the first drain region; and a second source region and a second drain region, each in contact with the one or more semiconductor bodies of the second set, such that the one or more semiconductor bodies of the second set are between the second source region and the second drain region.

Example 5 includes the integrated circuit of any one of Examples 1 through 4, and includes: a source region or drain region to one side of the first gate structure and in contact with the first set of one or more semiconductor bodies; and a spacer structure between the source or drain region and the first gate structure, the spacer structure including dielectric material.

Example 6 includes the integrated circuit of any one of Examples 1 through 5, and includes: a source region or drain region to one side of the first gate structure and in contact with the first set of one or more semiconductor bodies; and a spacer structure between the source or drain region and the first gate structure, the spacer structure including one or more portions of the void.

Example 7 includes the integrated circuit of any one of Examples 1 through 6 and 8 through 13, wherein the void is devoid of gas.

Example 8 includes the integrated circuit of Example 6 or 7, and includes a contact structure on the source region or drain region.

Example 9 includes the integrated circuit of any one of Examples 1 through 8, wherein the first set of one or more semiconductor bodies and the first gate structure are part of a p-type metal oxide semiconductor (PMOS) transistor structure, and the second set of one or more semiconductor bodies and the second gate structure are part of an n-type metal oxide semiconductor (NMOS) transistor structure.

Example 10 includes the integrated circuit of Example 9, wherein the PMOS transistor structure and the NMOS transistor structure are part of a forksheet device.

Example 11 includes the integrated circuit of any one of Examples 1 through 10, and includes a first contact structure on the first gate structure and a second contact on the second gate structure.

Example 12 includes the integrated circuit of any one of Examples 1 through 11, wherein the first gate structure includes a high-k gate dielectric and a p-type gate electrode, and the second gate structure includes the high-k gate dielectric and an n-type gate electrode.

Example 13 includes the integrated circuit of any one of Examples 1 through 12, wherein the first set of one or more semiconductor bodies comprise a first semiconductor material, and the second set of one or more semiconductor bodies comprise a second semiconductor material compositionally different from the first semiconductor material.

Example 14 is a fork sheet device comprising: a void; a first semiconductor body laterally extending from a first side of the void and having an end surface that defines part of the first side of the void; a second semiconductor body laterally extending from a second side of the void and having an end surface that defines part of the second side of the void; a first gate structure on the first semiconductor body; and a second gate structure on the second semiconductor body.

Example 15 includes the fork sheet device of Example 14, wherein the first gate structure includes one or more surfaces that define part of the first side of the void, and the second gate structure includes one or more surfaces that define part of the second side of the void.

Example 16 includes the fork sheet device of Example 14 or 15, wherein the end surfaces of the first and second semiconductor bodies are first end surfaces, and wherein: the first semiconductor body has a second end surface opposite its first end surface and that that is in contact with the first gate structure; and the second semiconductor body has a second end surface opposite its first end surface and that that is in contact with the second gate structure.

Example 17 includes the fork sheet device of any one of Examples 14 through 16, and includes: a first source region and a first drain region, each in contact with the first semiconductor body, such that the first semiconductor body is between the first source region and the first drain region; and a second source region and a second drain region, each in contact with the second semiconductor body, such that the second semiconductor body is between the second source region and the second drain region.

Example 18 includes the fork sheet device of any one of Examples 14 through 17, and includes: a source region or drain region to one side of the first gate structure and in contact with the first semiconductor body; and a spacer structure between the source or drain region and the first gate structure, the spacer structure including dielectric material.

Example 19 includes the fork sheet device of any one of Examples 14 through 18, and includes: a source region or drain region to one side of the first gate structure and in contact with the first semiconductor body; and a spacer structure between the source or drain region and the first gate structure, the spacer structure including one or more portions of the void.

Example 20 includes the fork sheet device of any one of Examples 14 through 19 and 21 through 25, wherein the void is devoid of gas.

Example 21 includes the fork sheet device of Example 19 or 20, and includes a contact structure on the source region or drain region.

Example 22 includes the fork sheet device of any one of Examples 14 through 21, wherein the first semiconductor body and the first gate structure are part of a p-type metal oxide semiconductor (PMOS) transistor structure, and the second semiconductor body and the second gate structure are part of an n-type metal oxide semiconductor (NMOS) transistor structure.

Example 23 includes the fork sheet device of any one of Examples 14 through 22, and includes a first contact structure on the first gate structure and a second contact on the second gate structure.

Example 24 includes the fork sheet device of any one of Examples 14 through 23, wherein the first gate structure includes a high-k gate dielectric and a p-type gate electrode, and the second gate structure includes the high-k gate dielectric and an n-type gate electrode.

Example 25 includes the fork sheet device of any one of Examples 14 through 24, wherein the first semiconductor body comprises a first semiconductor material, and the second semiconductor body comprises a second semiconductor material compositionally different from the first semiconductor material.

Example 26 is an integrated circuit comprising the forksheet device of any one of Examples 14 through 25.

Example 27 is an integrated circuit including: a void; a first semiconductor body laterally extending from a first side of the void and having a first end surface that defines part of the first side of the void; a second semiconductor body laterally extending from a second side of the void and having a first end surface that defines part of the second side of the void; a first gate structure on a second end surface of the first semiconductor body, the first gate structure including one or more surfaces that define part of the first side of the void; a second gate structure on a second end surface of the second semiconductor body, the second gate structure including one or more surfaces that define part of the second side of the void; a first source region and a first drain region, each in contact with the first semiconductor body, such that the first semiconductor body is between the first source region and the first drain region; and a second source region and a second drain region, each in contact with the second semiconductor body, such that the second semiconductor body is between the second source region and the second drain region.

Example 28 includes the integrated circuit of Example 27, and includes: a first spacer structure between the first source or drain region and the first gate structure, the first spacer structure including dielectric material; and a second spacer structure between the second source or drain region and the second gate structure, the second spacer structure including dielectric material.

Example 29 includes the integrated circuit of Example 27 or 28, and includes: a first spacer structure between the first source or drain region and the first gate structure, the first spacer structure including one or more portions of the void; and a second spacer structure between the second source or drain region and the second gate structure, the second spacer structure including one or more portions of the void.

Example 30 includes the integrated circuit of any one of Examples 27 through 29 and 31 through 35, wherein the void is devoid of gas.

Example 31 includes the integrated circuit of any one of Examples 27 through 30, and includes a contact structure on the source region or drain region.

Example 32 includes the integrated circuit of any one of Examples 27 through 31, wherein the first semiconductor body and the first gate structure are part of a p-type metal oxide semiconductor (PMOS) transistor structure, and the second semiconductor body and the second gate structure are part of an n-type metal oxide semiconductor (NMOS) transistor structure.

Example 33 includes the integrated circuit of any one of Examples 27 through 32, and includes a first contact structure on the first gate structure and a second contact on the second gate structure.

Example 34 includes the integrated circuit of any one of Examples 27 through 33, wherein the first gate structure includes a high-k gate dielectric and a p-type gate electrode, and the second gate structure includes the high-k gate dielectric and an n-type gate electrode.

Example 35 includes the integrated circuit of any one of Examples 27 through 34, wherein the first semiconductor body comprises a first semiconductor material, and the second semiconductor body comprises a second semiconductor material compositionally different from the first semiconductor material.

Example 36 is an electronic system comprising the integrated circuit of any one of Examples 1 through 13 and 26 through 35.

Example 37 is a memory chip comprising the integrated circuit of any one of Examples 1 through 13 and 26 through 35.

Example 38 is a microprocessor comprising the integrated circuit of any one of Examples 1 through 13 and 26 through 35.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a void;
   a first set of two or more semiconductor bodies each laterally extending from a first side of the void such that the void directly abuts at least one of the first set of two or more semiconductor bodies;
   a second set of two or more semiconductor bodies each laterally extending from a second side of the void such that the void directly abuts at least one of the second set of two or more semiconductor bodies;
   a first gate structure on the two or more semiconductor bodies of the first set; and
   a second gate structure on the two or more semiconductor bodies of the second set.

2. The integrated circuit of claim 1, wherein:
   each of the two or more semiconductor bodies of the first set has an end surface that defines a portion of the first side of the void; and
   each of the two or more semiconductor bodies of the second set has an end surface that defines a portion of the second side of the void.

3. The integrated circuit of claim 2, wherein the end surfaces of the semiconductor bodies of the first and second sets are first end surfaces, and wherein:
   each of the two or more semiconductor bodies of the first set has a second end surface opposite the first end surface and that that is in contact with the first gate structure; and
   each of the two or more semiconductor bodies of the second set has a second end surface opposite the first end surface and that that is in contact with the second gate structure.

4. The integrated circuit of claim 1, comprising:
   a first source region and a first drain region, each in contact with the two or more semiconductor bodies of the first set, such that the two or more semiconductor bodies of the first set are between the first source region and the first drain region; and
   a second source region and a second drain region, each in contact with the two or more semiconductor bodies of the second set, such that the two or more semiconductor bodies of the second set are between the second source region and the second drain region.

5. The integrated circuit of claim 1, comprising:
   a source region or drain region to one side of the first gate structure and in contact with the first set of two or more semiconductor bodies; and
   a spacer structure between the source or drain region and the first gate structure, the spacer structure including dielectric material.

6. The integrated circuit of claim 1, comprising:
   a source region or drain region to one side of the first gate structure and in contact with the first set of two or more semiconductor bodies; and
   a spacer structure between the source or drain region and the first gate structure, the spacer structure including one or more portions of the void.

7. The integrated circuit of claim 6, wherein the void is devoid of gas.

8. The integrated circuit of claim 6, comprising a contact structure on the source region or drain region.

9. The integrated circuit of claim 1, wherein the first set of two or more semiconductor bodies and the first gate structure are part of a p-type metal oxide semiconductor (PMOS) transistor structure, and the second set of two or more semiconductor bodies and the second gate structure are part of an n-type metal oxide semiconductor (NMOS) transistor structure.

10. The integrated circuit of claim 9, wherein the PMOS transistor structure and the NMOS transistor structure are part of a forksheet device.

11. The integrated circuit of claim 1, comprising a first contact structure on the first gate structure and a second contact on the second gate structure.

12. The integrated circuit of claim 1, wherein the first gate structure includes a high-k gate dielectric and a p-type gate electrode, and the second gate structure includes the high-k gate dielectric and an n-type gate electrode.

13. The integrated circuit of claim 1, wherein the first set of two or more semiconductor bodies comprise a first semiconductor material, and the second set of two or more semiconductor bodies comprise a second semiconductor material compositionally different from the first semiconductor material.

14. A fork sheet device comprising:
a void;
a first semiconductor body laterally extending from a first side of the void and having an end surface that defines part of the first side of the void such that the void directly abuts the end surface of the first semiconductor body;
a second semiconductor body laterally extending from a second side of the void and having an end surface that defines part of the second side of the void such that the void directly abuts the end surface of the second semiconductor body;
a first gate structure on the first semiconductor body; and
a second gate structure on the second semiconductor body.

15. The fork sheet device of claim 14, wherein the first gate structure includes one or more surfaces that define part of the first side of the void, and the second gate structure includes one or more surfaces that define part of the second side of the void.

16. The fork sheet device of claim 14, comprising:
a first source region and a first drain region, each in contact with the first semiconductor body, such that the first semiconductor body is between the first source region and the first drain region; and
a second source region and a second drain region, each in contact with the second semiconductor body, such that the second semiconductor body is between the second source region and the second drain region.

17. The fork sheet device of claim 14, comprising:
a source region or drain region to one side of the first gate structure and in contact with the first semiconductor body; and
a spacer structure between the source or drain region and the first gate structure, the spacer structure including one or more portions of the void.

18. An integrated circuit comprising:
a void;
a first semiconductor body laterally extending from a first side of the void and having a first end surface that defines part of the first side of the void such that the void directly abuts the first end surface of the first semiconductor body;
a second semiconductor body laterally extending from a second side of the void and having a first end surface that defines part of the second side of the void such that the void directly abuts the first end surface of the second semiconductor body;
a first gate structure on a second end surface of the first semiconductor body, the first gate structure including one or more surfaces that define part of the first side of the void;
a second gate structure on a second end surface of the second semiconductor body, the second gate structure including one or more surfaces that define part of the second side of the void;
a first source region and a first drain region, each in contact with the first semiconductor body, such that the first semiconductor body is between the first source region and the first drain region; and
a second source region and a second drain region, each in contact with the second semiconductor body, such that the second semiconductor body is between the second source region and the second drain region.

19. The integrated circuit of claim 18, comprising:
a first spacer structure between the first source or drain region and the first gate structure, the first spacer structure including dielectric material; and
a second spacer structure between the second source or drain region and the second gate structure, the second spacer structure including dielectric material.

20. The integrated circuit of claim 18, comprising:
a first spacer structure between the first source or drain region and the first gate structure, the first spacer structure including one or more portions of the void; and
a second spacer structure between the second source or drain region and the second gate structure, the second spacer structure including one or more portions of the void.

* * * * *